(12) United States Patent
Matsukizono et al.

(10) Patent No.: US 7,859,055 B2
(45) Date of Patent: Dec. 28, 2010

(54) THIN FILM TRANSISTOR

(75) Inventors: Hiroshi Matsukizono, Kizugawa (JP); Tadayoshi Miyamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 269 days.

(21) Appl. No.: 11/989,287

(22) PCT Filed: Jun. 1, 2006

(86) PCT No.: PCT/JP2006/310999

§ 371 (c)(1),
(2), (4) Date: Jan. 24, 2008

(87) PCT Pub. No.: WO2007/032128

PCT Pub. Date: Mar. 22, 2007

(65) Prior Publication Data

US 2009/0261355 A1   Oct. 22, 2009

(30) Foreign Application Priority Data

Sep. 16, 2005  (JP)  ............... 2005-270615
Oct. 14, 2005  (JP)  ............... 2005-300122

(51) Int. Cl.
H01L 27/12    (2006.01)
H01L 33/00    (2010.01)

(52) U.S. Cl. ................. 257/347; 257/64; 257/E29.286; 257/E21.24; 257/E51.005; 438/149

(58) Field of Classification Search ................. 257/347, 257/E29.286, E21.24, E33.053, 64, 88, E29.151, 257/E51.005; 438/164, 158, 778, 142, 149
See application file for complete search history.

(56) References Cited

U.S. PATENT DOCUMENTS 5,470,762 A * 11/1995 Codama et al. ............. 438/164

(Continued)

FOREIGN PATENT DOCUMENTS

CN    1081022 A    1/1994

(Continued)

OTHER PUBLICATIONS

International Search Report for PCT/JP2006/310999 mailed Aug. 15, 2006.

*Primary Examiner*—Thomas L Dickey
*Assistant Examiner*—Nikolay Yushin
(74) *Attorney, Agent, or Firm*—Nixon & Vanderhye P.C.

(57) ABSTRACT

To provide: a thin film transistor which can be operated with a low threshold and has a high transistor withstand voltage; a production method of the thin film transistor; and a semiconductor device, an active matrix substrate, and a display device, each including such a thin film transistor. The present invention is a thin film transistor including a semiconductor layer, a gate insulating film, a gate electrode on a substrate in this order, wherein a cross section of the semiconductor layer has a forward tapered shape; the gate insulating film covers a top surface and a side surface of the semiconductor layer; and the gate insulating film has a multilayer structure including a silicon oxide film on a semiconductor layer side and a film made of a material with a dielectric constant higher than a dielectric constant of silicon oxide on a gate electrode side; the gate insulating film satisfies $0.5 \leq B/A$ where a thickness of the gate insulating film on the top surface of the semiconductor layer is defined as A and a thickness of the gate insulating film on the side surface of the semiconductor layer is defined as B.

17 Claims, 5 Drawing Sheets

U.S. PATENT DOCUMENTS

| | | | |
|---|---|---|---|
| 5,757,030 A | 5/1998 | Codama et al. | |
| 6,124,154 A * | 9/2000 | Miyasaka | 438/151 |
| 6,362,507 B1 * | 3/2002 | Ogawa et al. | 257/350 |
| 2003/0025158 A1 | 2/2003 | Makita et al. | |
| 2004/0009635 A1 | 1/2004 | Nakasato et al. | |
| 2004/0147127 A1 * | 7/2004 | Noguchi et al. | 438/690 |
| 2005/0116305 A1 * | 6/2005 | Hwang et al. | 257/401 |
| 2005/0173763 A1 * | 8/2005 | Takeguchi et al. | 257/347 |
| 2005/0231107 A1 * | 10/2005 | Yamazaki et al. | 313/506 |

FOREIGN PATENT DOCUMENTS

| | | | |
|---|---|---|---|
| CN | 1395319 A | | 2/2003 |
| CN | 1469441 A | | 10/2004 |
| CN | 1622341 | | 6/2005 |
| EP | 1 536 482 A1 | | 6/2005 |
| JP | 4-240733 | | 8/1992 |
| JP | 5-90247 | | 4/1993 |
| JP | 05-090247 | * | 9/1993 |
| JP | 6-97442 | | 4/1994 |
| JP | 6-132303 | | 5/1994 |
| JP | 8-153699 | | 6/1996 |
| JP | 11-111991 | | 4/1999 |
| JP | 2000-275678 | | 10/2000 |
| JP | 2003-234344 | | 8/2003 |
| JP | 2005-167207 | | 6/2005 |
| JP | 2006-229185 | | 8/2006 |

* cited by examiner

THIN FILM TRANSISTOR

This application is the U.S. national phase of International Application No. PCT/JP2006/310999, filed 1 Jun. 2006, which designated the U.S. and claims priority to Japanese Patent Application Nos. 2005-270615, filed 16 Sep. 2005, and 2005-300122, filed 14 Oct. 2005, the entire contents of each of which are hereby incorporated by reference.

TECHNICAL FIELD

The present invention relates to a thin film transistor. More specifically, the present invention relates to: a thin film transistor that is preferably used in an active matrix substrate, a semiconductor device, and the like, used in a display device such as a liquid crystal display device, and an organic electroluminescent display device; a production method of the thin film transistor; and a semiconductor device, an active matrix substrate, and a display device, each including the thin film transistor.

BACKGROUND ART

A MOS (Metal Oxide Semiconductor) transistor is a field effect transistor including a gate having a MOS structure. Such a transistor is called MOS-FET. The MOS transistor has been used in most of memories, microprocessors, and the like, because the MOS structure is suitable for forming an integrated circuit. Among these, a thin film transistor (hereinafter, also referred to as "TFT") including a semiconductor thin film layer made of silicon and the like as an active layer has been used in various applications, for example, as a switching element in a liquid crystal display device.

For display devices such as a liquid crystal display device including such a TFT, further reduction in power consumption has been strongly needed, in addition to increase in the screen size and improvement in definition of image displays. Also for the TFT used in the display device, reduction in power consumption has been needed. In order to reduce the power consumption of the TFT, it is essential to form a gate insulating film to have a thinner thickness of about 70 nm or less, for example, thereby operating the TFT with a low threshold. A silicon oxide film excellent in interface characteristics is generally used as the gate insulating film. If the gate insulating film has a single layer structure of a silicon oxide film, the silicon oxide film is thinned and thereby the TFT can be operated with a low threshold. However, a breakdown voltage, that is, a transistor withstand voltage is reduced, and defects such as a leakage defect between the semiconductor layer and the gate electrode layer are easily caused. Accordingly, if the TFT having a gate insulating film consisting of a single silicon oxide film is used as a switching element in a liquid crystal display device, point defects in a panel initial condition, defects in device reliability are increased, which possibly leads to reduction in yield. For this problem, the temperature at which the silicon oxide film is formed is decreased, and thereby the coverage of the silicon oxide film can be improved. However, the decrease in the film formation temperature reduces a flat band voltage of the silicon oxide film and increases the threshold. Therefore, a gate insulating film which satisfies both of the coverage and the low threshold is hard to obtain.

Materials with a dielectric constant higher than a dielectric constant of silicon oxide, for example, silicon nitride, have been recently used for the gate insulating film. According to a gate insulating film having a single layer structure consisting of a silicon nitride film, a gate insulating film having a two-layer structure including stacked silicon oxide film and silicon nitride film, and the like, the film thickness needed to obtain a capacitance equivalent to a capacitance in the case where the gate insulating film having a single layer structure consisting of a silicon oxide film becomes large because of the difference in dielectric constant between the silicon oxide and the silicon nitride, and therefore, reduction in withstand voltage can be suppressed. Further, the transistor withstand voltage can be improved. For example, a TFT including a gate insulating film having a two-layer structure including stacked lower silicon nitride film (on the gate electrode side) and upper silicon oxide film (on the semiconductor layer side) is disclosed (for example, refer to Patent Document 1). However, according to this TFT, the silicon oxide has a large thickness of 120 nm or more. Therefore, it is difficult to simultaneously realize a low threshold operation of the TFT and production of a liquid crystal display device with low power consumption.

Accordingly, the TFT including a gate insulating film having a multilayer structure also has a room for improvement in that the low threshold operation becomes difficult if the transistor withstand voltage is increased by improvement in coverage.

[Patent Document 1]

Japanese Kokai Publication No. Hei-11-111991

DISCLOSURE OF INVENTION

An aspect of the present invention addresses the above-mentioned state of the art. The present invention has an object to provide: a thin film transistor that can be operated with a low threshold and shows a high transistor withstand voltage; a production of the thin film transistor; and a semiconductor device, an active matrix substrate, and a display device, each including the thin film transistor.

The present inventors made various investigations on a thin film transistor that can be operated with a low threshold and shows a high transistor withstand voltage. The inventors noted the configuration of the gate insulating film. The inventors found that the thin film transistor can be operated with a low threshold and the transistor withstanding voltage can be increased if the gate insulating film has a multilayer structure including a silicon oxide film formed on the semiconductor layer side and a film made of a material with a dielectric constant higher than a dielectric constant of silicon oxide, formed on the gate electrode side, and the gate insulating film satisfies $0.5 \leq B/A$ where the thickness of the gate insulating film on the top surface of the semiconductor layer is defined as A and the thickness of the gate insulating film on the side surface of the semiconductor layer is defined as B. As a result, the above-mentioned problems have been admirably solved, leading to completion of these aspects of the present invention.

That is, an embodiment of the present invention is directed toward a thin film transistor including a semiconductor layer, a gate insulating film, a gate electrode on a substrate in this order, wherein a cross section of the semiconductor layer has a forward tapered shape; the gate insulating film covers a top surface and a side surface of the semiconductor layer; the gate insulating film has a multilayer structure including a silicon oxide film on a semiconductor layer side and a film made of a material with a dielectric constant higher than a dielectric constant of silicon oxide on a gate electrode side; and the gate insulating film satisfies $0.5 \leq B/A$ where a thickness of the gate insulating film on the top surface of the semiconductor layer is defined as A and a thickness of the gate insulating film on the side surface of the semiconductor layer is defined as B.

According to the thin film transistor embodiment of the present invention, a semiconductor layer, a gate insulating film, and a gate electrode are stacked on a substrate in this order. The TFT has a so-called top-gate structure on the substrate. That is, in the thin film transistor, a semiconductor layer, a gate insulating film, and a gate electrode are stacked on the substrate in this order from the substrate side. It is preferable that the semiconductor layer includes a channel region in a region just below the gate electrode and source and drain regions in a region other than the region just below the gate electrode. The material for the semiconductor layer is preferably continuous grain silicon (CG silicon), polycrystalline silicon (polysilicon), and the like because such a material can be formed as a film at a low temperature process and has an excellent electric field effect mobility. Into the source and drain regions in the semiconductor layer, impurities are generally doped. It is preferable that the gate electrode include a metal in order to suppress phonon oscillation inside the upper gate insulating film. For example, a compound including aluminum (Al), tantalum (Ta), tungsten (W), molybdenum (Mo) and the like is used. The gate electrode may be a stacked body made of some of the above-mentioned materials. The substrate is preferably made of an insulating material, and glass and the like is preferably used.

In the embodiment, the cross section of the above-mentioned semiconductor layer has a forward tapered shape and the gate insulating film covers the top surface and the side surface of the above-mentioned semiconductor layer. As a result, cracks and the like can be suppressed from being generated in the gate insulating film formed on the semiconductor layer. The forward tapered shape means that the width of the cross section of the semiconductor layer becomes smaller toward the gate insulating film direction and the width of the cross section of the semiconductor layer is substantially uniform toward the gate insulating film direction.

The gate insulating film can have a multilayer structure including a silicon oxide film on the semiconductor layer side and a film made of a material with a dielectric constant higher than a dielectric constant of silicon oxide on the gate electrode side. The gate insulating film having such a multilayer structure has a thickness larger than a thickness of the gate insulating film having a single layer structure of a silicon oxide film, at the same capacitance. Therefore, the coverage of the gate insulating film and the transistor withstand voltage can be improved and thereby the reliability of the TFTs can be improved. Further, the silicon oxide film is formed on the semiconductor layer side, and therefore, excellent interface characteristics between the semiconductor layer and the gate insulating film can be secured. The transistor withstands voltage means a voltage when dielectric breakdown is caused between the semiconductor layer and the gate electrode, that is, a breakdown voltage.

Preferably, the above-mentioned gate insulating film satisfies $0.5 \leq B/A$ where the thickness of the gate insulating film on the top surface of the semiconductor layer is defined as A and the thickness of the gate insulating film on the side surface of the semiconductor layer is defined as B. The gate insulating film more preferably satisfies $0.55 \leq B/A$. Thus, the gate insulating film of the present invention is excellent in step coverage and therefore generation of defects such as leakage current defects caused by cracks in the gate insulating film can be suppressed. Therefore, the reliability of the TFT can be improved. If the film thickness ratio B/A is less than 0.5, the defects such as leakage defects between the semiconductor layer and the gate electrode layer may be caused. With respect to the thickness A of the gate insulating film on the top surface of the semiconductor layer and the thickness B on the side surface of the gate insulating film of the semiconductor layer, as shown in FIG. 8, an average thickness 20 of the gate insulating film on the top surface of the semiconductor layer is used as the thickness A. In addition, the minimum thickness 21 of the gate insulating film on the side surface of the semiconductor layer is used as the thickness B. In order to satisfy the above-mentioned film thickness ratio B/A, the temperature at which the gate insulating film is formed needs to be set to a low temperature (for example, a temperature of 370° C. or less) if a single silicon oxide film and the like is used as the gate insulating film. However, when the gate insulating film has the above-mentioned multilayer structure of the embodiment of the present invention, the temperature at which the gate insulating film is formed can be set to a high temperature (for example, a temperature of 400° C. or more). As a result, a flat band voltage can be improved. Accordingly, the improvement in step coverage and the improvement in flat band voltage can be simultaneously permitted according to the present invention. As a result, the withstand voltage of the TFT can be secured and simultaneously the low threshold operation of the TFT can be permitted.

Silicon dioxide ($SiO_2$) and the like are mentioned as the above-mentioned silicon oxide constituting the silicon oxide film, for example. It is preferable that the film made of a material with a dielectric constant higher than a dielectric constant of silicon oxide is a silicon nitride film. $SiN_x$ (x is any number) and the like may be mentioned as silicon nitride constituting the silicon nitride film. Among them, trisilicon tetranitride ($Si_3N_4$), siliconoxynitride, and the like are preferably used. Other examples of the material with a dielectric constant higher than a dielectric constant of silicon oxide, other than silicon nitride, include tantalum oxides such as titanium dioxide ($TiO_2$), dialuminum trioxide ($Al_2O_3$), and ditantalum pentaoxide ($Ta_2O_5$), hafnium dioxide ($HfO_2$), and zirconium dioxide ($ZrO_2$). The dielectric constant of the material constituting the above-mentioned film made of a material with a dielectric constant higher than a dielectric constant of silicon oxide is preferably 1.5 times or more larger than that of silicon oxide. Further, with respect to the configuration of the above-mentioned film made of a material with a dielectric constant higher than a dielectric constant of silicon oxide, the film may be a stacked body made of some of the above-mentioned compounds, but it preferably has a single layer structure in terms of simplification of the production steps. If the above-mentioned film made of a material with a dielectric constant higher than that of silicon oxide has a multilayer structure made of some of the above-mentioned compounds, it is preferable that an average dielectric constant of the compounds is 1.5 times or more large than the dielectric constant of the silicon oxide.

The method for forming film including the above-mentioned silicon oxide film and the above-mentioned film made of a material with a dielectric constant higher than a dielectric constant of silicon oxide is not especially limited. A normal pressure CVD (Chemical Vapor Deposition) method, a low pressure CVD method, a plasma CVD method, a remote plasma CVD method, and the like, may be used. The raw material gas used for forming the silicon oxide film is not especially limited, but tetra ethoxy silane (TEOS) is preferable. Further, if the film made of a material with a high dielectric constant higher than a dielectric constant of silicon oxide is made of silicon nitride, a mixed gas of monosilane ($SiH_4$) and ammonia ($NH_3$) and the like may be used as the raw material gas.

The configuration of the thin film transistor of the present invention is not especially limited as long as the thin film transistor essentially includes the above-mentioned components. The thin film transistor may or may not include other components.

The inventive gate insulating film is excellent in coverage for layers below the gate insulating film. Therefore, such a gate insulating film can be used in a TFT having a structure in which a gate electrode is disposed below the gate insulating film, that is, a bottom-gate structure. Such a TFT can exhibit the same operation and effects. In this case, it is preferable that the cross section of the gate electrode has a forward tapered shape.

It is preferable that the side surface of the semiconductor layer has a taper angle of 60° or more. It is more preferable that the side surface of the semiconductor layer has a taper angle of 80° or more. According to this, a rapid increase in drain current, generated in a thin film transistor including a slightly inclined semiconductor layer, that is, a kink phenomenon can be effectively suppressed. Further, an area of the semiconductor layer when viewed in the normal direction of the substrate can be reduced, and therefore, the TFT can be downsized. As a result, if the inventive TFT is used in an active matrix substrate in a liquid crystal display device and the like, a pixel aperture ratio can be enlarged, and thereby high-definition images can be displayed. The gate insulating film has a multilayer structure and has excellent step coverage for the semiconductor layer. Therefore, the gate insulating film can sufficiently cover the semiconductor layer without generation of cracks, even if the semiconductor layer has a taper angle of as large as 60° or more. If the taper angle on the side surface of the semiconductor layer is less than 60°, the kink phenomenon may significantly deteriorate the TFT characteristics.

The present invention is also directed to a method for producing the thin film transistor, wherein the gate insulating film having a multilayer structure is continuously formed in one vacuum chamber without breaking vacuum at 400° C. or more. The temperature at which the gate insulating film is formed is more preferably 430° C. or more. The gate insulating film having a multilayer structure can be formed without further complicating the formation steps in comparison to the step of forming the gate insulating film consisting of a single layer. Therefore, the production processes of the TFT substrate can be simplified, and the productivity can be secured. In addition, an increase in production costs can be prevented. In addition, the interface between the silicon oxide film and the film made of a material with a dielectric constant higher than a dielectric constant of silicon oxide can be prevented from being polluted when the gate insulating film is formed. As a result, a gate insulating film with excellent qualities can be formed. The gate insulating film is formed while the temperature is maintained at 400° C. or more. Therefore, reduction in flat band voltage in the silicon oxide film can be suppressed, and as a result, the low threshold operation of the TFT can be permitted. If the film formation temperature is less than 400° C., an increase in flat band voltage increases a threshold of the TFT. As a result, a high load is applied to the gate insulating film and defects such as increase in leak current may be generated. The vacuum in the present description means a pressure of 500 Pa or less and preferably 300 Pa or less.

The present invention is further directed to a method for producing the thin film transistor, wherein the semiconductor layer is oxidized using ozone before forming the gate insulating film. The surface of the semiconductor layer is oxidized and thereby an oxidized silicon layer can be previously formed. Therefore, a TFT excellent in characteristics of the interface between the semiconductor layer and the gate insulating film can be prepared. An ozone water obtained by dissolving ozone into a purified water is preferably used as an oxidizing species. According to this, the oxidization for the semiconductor layer can be performed at a lower temperature in comparison with the case where the semiconductor layer is thermally oxidized using oxygen. Therefore, the production processes can be performed at a low temperature. The ozone concentration, the treatment time, and the like are not especially limited, and may be appropriately determined.

The present invention is also directed to a semiconductor device or an active matrix substrate including the thin film transistor substrate. Examples of the semiconductor device of the present invention include a device including a CMOS circuit, an integrated circuit (IC), and a solar cell. The active matrix substrate can be preferably used in a monolithic liquid crystal display device including a thin film transistor substrate that is integrated with peripheral circuits. Further, the present invention is a display device including the active matrix substrate. Examples of the display devices of the present invention include a liquid crystal display device, an organic electroluminescent display device. The semiconductor device, the active matrix substrate, and the display device of the present invention each include the TFTs in the present invention, and therefore each secure the transistor with stand voltage, and further permit a low threshold operation of the TFTs. Accordingly, the power consumption can be reduced.

According to a thin film transistor aspect of the present invention, the gate insulating film has a multilayer structure including a silicon oxide film formed on the semiconductor layer side and a film made of a material with a dielectric constant higher than a dielectric constant of silicon oxide, formed on the gate electrode side. In addition, the gate insulating film satisfies $0.5 \leq B/A$ where the thickness of the gate insulating film on the top surface of the semiconductor layer is defined as A and the thickness of the gate insulating film on the side surface of the semiconductor layer is defined as B. As a result, a low threshold operation of the thin film transistor and increase in transistor withstand voltage are permitted. The inventive thin film transistor is useful for reduction in power consumption of various semiconductor devices.

DETAILED DESCRIPTION OF THE INVENTION

One or more aspects of the present invention are mentioned in more detail below with reference to Embodiments, but the present invention is not limited to only these Embodiments.

Embodiment 1

A thin film transistor (TFT) in accordance with an embodiment of the present invention is mentioned with reference to FIG. 1. FIG. 1 is a view schematically showing a TFT configuration in accordance with the present Embodiment. FIGS. 2(*a*) to 2(*f*) are cross-sectional views schematically showing a production process flow of the TFT in accordance with the present Embodiment. As shown in FIG. 1, the TFT in accordance with the present Embodiment has a top-gate structure. The TFT includes, as a gate insulating film 13, a multilayer film including a silicon oxide (SiOx) film 13*a* and a silicon nitride (SiNx) film 13*b*. More specifically, on a glass substrate (insulating substrate) 10, a base coat insulating film 11 that is a multilayer film including a silicon oxide ($SiO_2$) layer as an upper layer and a silicon oxynitride (SiNO) layer as a lower layer; a semiconductor layer 12 including a channel region 17, a source region 16*a*, and a drain region 16*b*; a gate insulating film 13; a gate electrode 14; an inter layer insulating film 18 are stacked in this order. The source region 16a in the semiconductor layer 12 is electrically connected to a source electrode 20a on an inter layer insulating film 18 through a contact hole 19a. The drain region 16b in the semiconductor layer 12 is electrically connected to a drain electrode 20b on the inter layer insulating film 18 through a contact hole 19b. The cross section of the semiconductor layer 12 has a forward tapered shape. The taper angle made by the glass substrate 10 and the side surface of the semiconductor layer 12 is 80°.

The production method of the TFT in the TFT substrate in accordance with Embodiment 1 is mentioned below with reference to FIGS. 2(a) to 2(f).

First, as shown in FIG. 2(a), the base coat insulating film 11 is formed on the glass substrate 10. Thereon, an amorphous silicon (a-Si) film 2 is formed. A $SiO_2$ film, a SiNx film, or a SiNO film, or a stacked body of these films may be formed as the base coat insulating film 11. The a-Si film 2 has a thickness of 50 nm, for example. The method of forming the a-Si film 2 is not especially limited, and a PCVD (Plasma Chemical Vapor Deposition) method and the like may be used.

Successively, the a-Si film 2 is crystallized to form a polysilicon (poly-Si) film. Specifically, the a-Si film 2 can be crystallized by being irradiated with an excimer laser (excimer laser annealing method). Alternatively, the a-Si film 2 may be crystallized by being subjected to a thermal treatment at 600° C. (solid-phase crystallization). Then, a resist layer is formed on the poly-Si film, and the poly-Si film is patterned by dry etching using the resist layer as a patterning mask. As a result, the semiconductor layer 12 is formed to have an island shape with a taper angle of 80°, as shown in FIG. 2(b). The gas used in the dry etching is not especially limited, and a mixed gas of carbon tetra fluoride gas and oxygen gas, a mixed gas of sulfur hexa fluoride gas and hydrogen chloride gas, and the like are mentioned. A plasma etching (PE) mode and a reactive ion etching (RIE) mode, and the like may be used as an etching system.

As shown in FIG. 2(c), the gate insulating film 13 that covers the semiconductor layer 12 is formed at a film formation temperature of 430° C. by a CVD method and the like. The gate insulating film 13 has a multilayer structure including a lower $SiO_2$ film 13a and an upper SiNx film 13b. In order to provide a liquid crystal display device with low power consumption, the gate insulating film is set to have a thickness of 70 nm on the silicon oxide capacitance equivalent basis. Base on this, in the gate insulating film in the present Embodiment, the lower $SiO_2$ film 13a is formed to have a thickness of 50 nm and the upper SiNx film 13 bis formed to have a thickness of 40 nm. Herein, the film thickness on the silicon oxide capacitance equivalent basis means a film thickness calculated from a formula of $T1+T2\times\in 1/\in 2$ where the thickness of the silicon oxide film is defined as T1, the dielectric constant of the silicon oxide is defined as $\in 1$, and the thickness of the film made of a material with a dielectric constant higher than that of silicon oxide (the silicon nitride film in the present Embodiment) is defined as T2, the dielectric constant of the material with a dielectric constant higher than that of silicon oxide (the silicon nitride in the present Embodiment) is defined as $\in 2$. With respect to each raw material gas used for forming the films, tetra ethoxy silane (TEOS) may be preferably used for forming the $SiO_2$ film 13a, and a mixed gas of monosilane ($SiH_4$) and ammonia ($NH_3$) may be preferably used as the SiNx film 13b. It is preferable that the $SiO_2$ film 13a and the SiNx film 13b are continuously formed in one vacuum chamber without breaking vacuum. If the $SiO_2$ film 13a and the SiNx film 13b are discontinuously formed, the interface between the $SiO_2$ film 13a and the SiNx film 13b may be polluted. Therefore, the continuous treatment is preferably used for forming the gate insulating film 13 with excellent qualities. As a result, the gate insulating film 13 is formed to have a film thickness ratio B/A of 0.55 where the thickness of the gate insulating film 13 on the top surface of the semiconductor layer is defined as A and the thickness of the gate insulating film 13 on the side surface of the semiconductor layer is defined as B.

As shown in FIG. 2(d), the gate electrode 14 is formed on the gate insulating film 13 to cover the part that forms a channel region in the semiconductor layer 12. A conductive film is stacked on the gate insulating film 13 by a sputtering method, a CVD method, and the like, and this conductive film is patterned into a specific shape to form the gate electrode 14. With respect to the material for the gate electrode 14, a metal compound including aluminum (Al), tantalum (Ta), tungsten (W), molybdenum (Mo), and the like is preferable. A stacked body consisting of some of the above-mentioned materials may be used.

As shown in FIG. 2(e), impurity ions 15 are injected into the semiconductor layer 12 using the gate electrode 14 as a mask to form a source region 16a and a drain region 16b. In the present Embodiment, phosphorus ions are used as the impurity ions 15 to form an N-channel TFT. The impurity ions 15 are not especially limited to the phosphorus ions, and may be ions of elements in the 15 Group other than phosphorus or ions of elements in the 13 Groups such as boron. A P-channel TFT is formed if the ions of elements in the 13 Groups such as boron are injected into the source region 16a and the drain region 16b.

Successively, an inter layer insulating film 18 is formed over the entire substrate 10. Then, a contact hole 19a that penetrates the inter layer insulating film 18 and the gate insulating film 13 to reach the source region 16a and a contact hole 19b that penetrates the inter layer insulating film 18 and the gate insulating film 13 to reach the drain region 16b are formed. Finally, a source electrode 20a that is electrically connected to the source region 16a and a drain electrode 20b that is electrically connected to the drain region 16b are formed in each of the contact holes 19a and 19b and on the inter layer insulating film 18. In such a manner, a TFT is completed.

If the TFT in accordance with the present Embodiment is used as a switching element in a display region of a liquid crystal display device, a passivation film that covers the TFT, a pixel electrode (ITO electrode) that is connected to the drain electrode 20b are further formed after the above-mentioned steps.

Embodiment 2

A thin film transistor (TFT) in Embodiment 2 is mentioned. The TFT in the present Embodiment is prepared in the same manner as in Embodiment 1, except that the film formation temperature for a gate insulating film is changed into 400° C. from 430° C. As a result, a gate insulating film is formed to have a film thickness ratio B/A of 0.55 where the thickness of the gate insulating film on the top surface of the semiconductor layer is defined as A and the thickness of the gate insulating film on the side surface of the semiconductor layer is defined as B.

Embodiment 3

A thin film transistor (TFT) in Embodiment 3 is mentioned. The TFT in the present Embodiment is prepared in the same manner as in Embodiment 1, except that the film formation temperature for a gate insulating film is changed into 370° C. from 430° C. As a result, a gate insulating film is formed to have a film thickness ratio B/A of 0.55 where the thickness of the gate insulating film on the top surface of the semiconductor layer is defined as A and the thickness of the gate insulating film on the side surface of the semiconductor layer is defined as B.

Embodiment 4

A thin film transistor (TFT) in Embodiment 4 is mentioned. The TFT in the present Embodiment is prepared in the same manner as in Embodiment 1, except that the film formation temperature for a gate insulating film is changed into 400° C. from 430° C., and oxidization for the semiconductor layer is performed before forming the gate insulating film. The oxidization is performed by spin-coating of an ozone water (at a concentration of 10 ppm) obtained by dissolving ozone into a purified water at a room temperature for 60 seconds.

Comparative Embodiment 1

A thin film transistor (TFT) in Comparative Embodiment 1 is mentioned. The TFT in the present Comparative Embodiment has a configuration in which the gate insulating film that is a multilayer film including a silicon oxide ($SiO_2$) film and a silicon nitride (SiNx) film in accordance with Embodiment 1 is changed into a single layer-film of a silicon oxide ($SiO_2$) film. With respect to other configurations, the TFT in the present Comparative Embodiment is the same as the TFT in Embodiment 1. The silicon oxide ($SiO_2$) film that is a gate insulating film is formed to have a thickness of 100 nm. In the present Comparative Embodiment, a silicon oxide ($SiO_2$) film is formed in the same manner as in Embodiment 1, except that the film formation temperature is 400° C. As a result, a gate insulating film is formed to have a film thickness ratio B/A of 0.36 where the thickness of the gate insulating film on the top surface of the semiconductor layer is defined as A and the thickness of the gate insulating film on the side surface of the semiconductor layer is defined as B.

Comparative Embodiment 2

A thin film transistor (TFT) in Comparative Embodiment 2 is mentioned. The TFT in the present Comparative Embodiment is prepared in the same manner as in Comparative Embodiment 1, except that the thickness of the gate insulating film is changed into 70 nm from 100 nm and the film formation temperature for a gate insulating film is 430° C. As a result, a gate insulating film is formed to have a film thickness ratio B/A of 0.28 where the thickness of the gate insulating film on the top surface of the semiconductor layer is defined as A and the thickness of the gate insulating film on the side surface of the semiconductor layer is defined as B.

Comparative Embodiment 3

A thin film transistor (TFT) in Comparative Embodiment 3 is mentioned. The TFT in the present Comparative Embodiment is prepared in the same manner as in Comparative Embodiment 2, except that the film formation temperature for a gate insulating film is changed into 400° C. from 430° C. As a result, a gate insulating film is formed to have a film thickness ratio B/A of 0.36 where the thickness of the gate insulating film on the top surface of the semiconductor layer is defined as A and the thickness of the gate insulating film on the side surface of the semiconductor layer is defined as B.

Comparative Embodiment 4

A thin film transistor (TFT) in Comparative Embodiment 4 is mentioned. The TFT in the present Comparative Embodiment is prepared in the same manner as in Comparative Embodiment 2, except that the film formation temperature for a gate insulating film is changed into 370° C. from 430° C. As a result, a gate insulating film is formed to have a film thickness ratio B/A of 0.43 where the thickness of the gate insulating film on the top surface of the semiconductor layer is defined as A and the thickness of the gate insulating film on the side surface of the semiconductor layer is defined as B.

The following Table 1 shows results showing comparison of transistor withstand voltages among the TFTs in Embodiment 1 and Comparative Embodiments 1 and 3. The results show that the TFT in Embodiment 1 can show a withstand voltage about two times higher than a withstand voltage of the TFT including a conventional single gate insulating film in Comparative Embodiment 3 if the gate insulating film is formed to have a thickness of 70 nm on the silicon oxide capacitance equivalent basis. Herein, the withstand voltage means a voltage when dielectric breakdown is caused between the semiconductor layer and the gate electrode, that is, a breakdown voltage.

TABLE 1

| | Transistor withstand voltage of TFT | | | | |
|---|---|---|---|---|---|
| | Film formation temperature [° C.] | Film comfiguration | Actual film thickness [nm] | Capacitance film thickness※ [nm] | Withstand voltage [V] |
| Embodiment 1 | 430° C. | SiNx/TEOS-$SiO_2$ multilayer film | 40/50 | 70 | 55 |
| Comparative Embodiment 1 | 400° C. | TEOS-$SiO_2$ single layer | 100 | 100 | 60 |
| Comparative Embodiment 3 | 400° C. | TEOS-$SiO_2$ single layer | 70 | 70 | 30 |

※Capacitance film thickness means a film thickness on the silicon oxide capacitance equivalent basis Experiments using the TFTs and the like obtained in Embodiments 1 to 4 and Comparative Embodiments 2 to 4 are mentioned below.

Experiment 1

Verification of relationship between the transistor withstand voltage and the film thickness ratio B/A where the thickness of the gate insulating film on the side surface of the semiconductor layer is defined as B and the thickness of the gate insulating film on the top surface of the semiconductor layer is defined as A FIG. 3 is a graph showing verification results of the relationship between the transistor withstand voltage that is an index of the insulating resistance and the film thickness ratio B/A where the thickness of the gate insulating film on the side surface of the semiconductor layer is defined as B and the thickness of the gate insulating film on the top surface of the semiconductor layer is defined as A, in Embodiment 2 and Comparative Embodiment 3. FIG. 3 shows that the gate insulating film in Embodiment 2 has excellent coverage, as shown by the film thickness ratio B/A of 0.5 or more. FIG. 3 also shows that the gate insulating film has a transistor withstand voltage of 50 V or more, which is enough in terms of the practical use. In contrast, the gate insulating film in Comparative Embodiment 3 has insufficient coverage, as shown by the film thickness ratio B/A of about 0.35. Further, the gate insulating film has a transistor withstand voltage of about 30 V, which is insufficient in terms of the practical use. Samples for the film thickness ratio measurement are additionally prepared under the same conditions as those in Embodiment 1 and Comparative Embodiment 2. Using the samples, the film thickness ratio B/A where the thickness of the gate insulating film on the side surface of the semiconductor layer is defined as B and the thickness of the gate insulating film on the top surface of the semiconductor layer is defined as A is measured. With respect to measurement conditions, as shown in FIG. 4, the gate insulating film 13 (in Embodiment 2, the gate insulating film 13 includes a silicon oxide film of 50 nm and a silicon nitride film of 40 nm, and in Comparative Embodiment 3, the gate insulating film 13 includes a silicon oxide film of 70 nm) is formed on a silicon wafer substrate 25 having a pattern obtained by etching an silicon oxide layer 24 having a thickness of 500 nm to have a almost right angle. Then, the thickness A of the gate insulating film 13 on the horizontal part 26 of the silicon oxide layer 24 and the thickness B of the gate insulating film 13 on the vertical part 27 of the silicon oxide layer 24 are measured and the film thickness ratio B/A is calculated.

Experiment 2

Verification of relationships between the film formation temperature, and the flat band voltage and the film thickness ratio B/A where the thickness of the gate insulating film on the side surface of the semiconductor layer is defined as B and the thickness of the gate insulating film on the top surface of the semiconductor layer is defined as A FIG. 5 is a graph showing verification results of the relationships between the film formation temperature, and the flat band voltage (Vfb) and the film thickness ratio B/A where the thickness of the gate insulating film on the side surface of the semiconductor layer is defined as B and the thickness of the gate insulating film on the top surface of the semiconductor layer is defined as A, in Embodiments 1 to 3. FIG. 5 shows that the film thickness ratio B/A is not reduced and the coverage is not deteriorated even if the film formation temperature is increased to 370° C. in Embodiment 3, 400° C. in Embodiment 2, and 430° C. in Embodiment 1. If the film formation temperature is increased, the flat band voltage tends to be closer to 0. Accordingly, a TFT including the gate insulating film that shows a low threshold and a high withstand voltage at a film formation temperature of 400° C. or more can be formed.

FIG. 6 is a graph showing verification results of the relationships between the film formation temperature, and the flat band voltage (Vfb) and the film thickness ratio B/A where the thickness of the gate insulating film on the side surface of the semiconductor layer is defined as B and the thickness of the gate insulating film on the top surface of the semiconductor layer is defined as A, in Comparative Examples 2 to 4. FIG. 6 shows that the single silicon oxide films in Comparative Examples 2 to 4 cannot simultaneously satisfy the film thickness ratio B/A, that is, the coverage, and the flat band voltage, because the coverage and the flat band voltage are in a trade-off relationship.

Experiment 3

Verification of relationship between the ozone oxidization and the threshold voltage FIG. 7 is a graph showing the verification results of the relationship between the ozone oxidization and the threshold voltage (Vth) of the TFT, in Embodiments 2 and 4. FIG. 7 shows that the ozone oxidization for the semiconductor layer before formation of the insulating film reduces the threshold voltage of the TFT.

The present application claims priority under the Paris Convention and the domestic law in the country to be entered into national phase on Patent Application No. 2005-270615 filed in Japan on Sep. 16, 2005, and No. 2005-300122 filed in Japan on Oct. 14, 2005 the entire contents of which are hereby incorporated by reference.

The terms "or more" and "or less" in the present description include the value described.

EXPLANATION OF NUMERALS AND SYMBOLS

Figure 1:
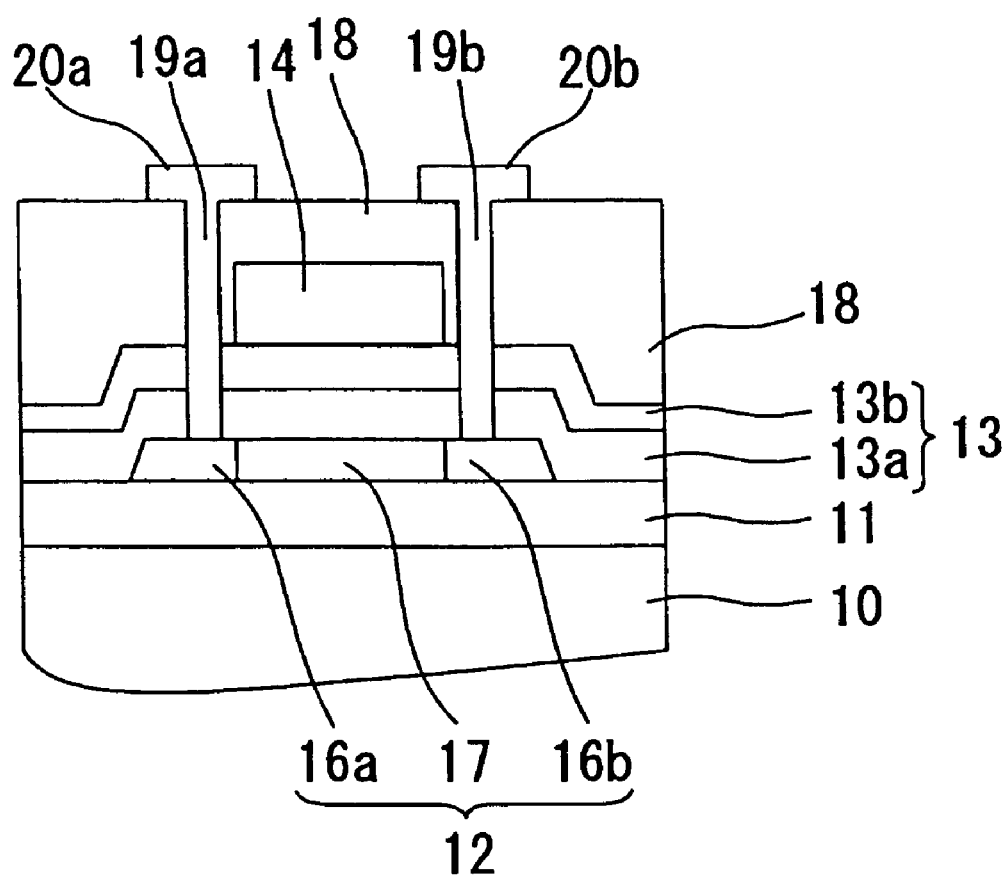
FIG. 1 is a cross-sectional view schematically showing a configuration of the thin film transistor (TFT) in accordance with Embodiment 1.
Figure 2:
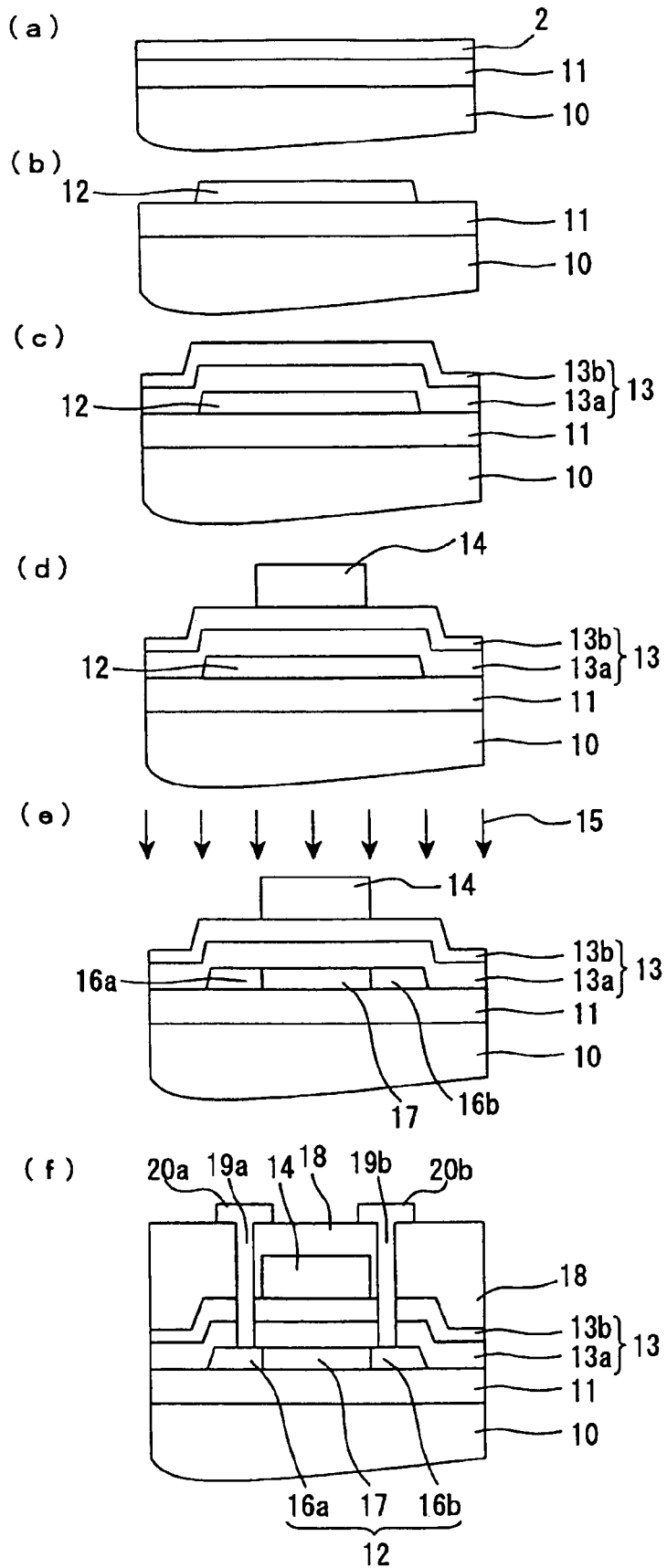
FIGS. 2(a) to 2(f) are cross-sectional views schematically showing a production process flow of the thin film transistor (TFT) in accordance with Embodiment 1.
Figure 3:
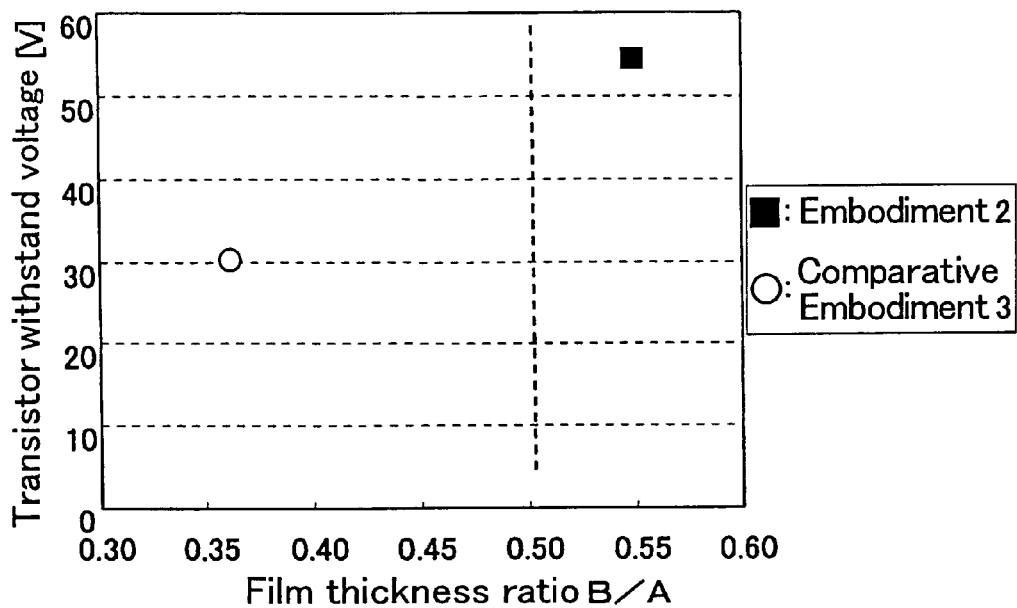
FIG. 3 is a graph showing a relationship between the withstand voltage and the film thickness ratio B/A where the thickness of the gate insulating film on the side surface of the semiconductor layer is defined as B and the thickness of the gate insulating film on the top surface of the semiconductor layer is defined as A, in Embodiment 2 and Comparative Embodiment 3.
Figure 4:
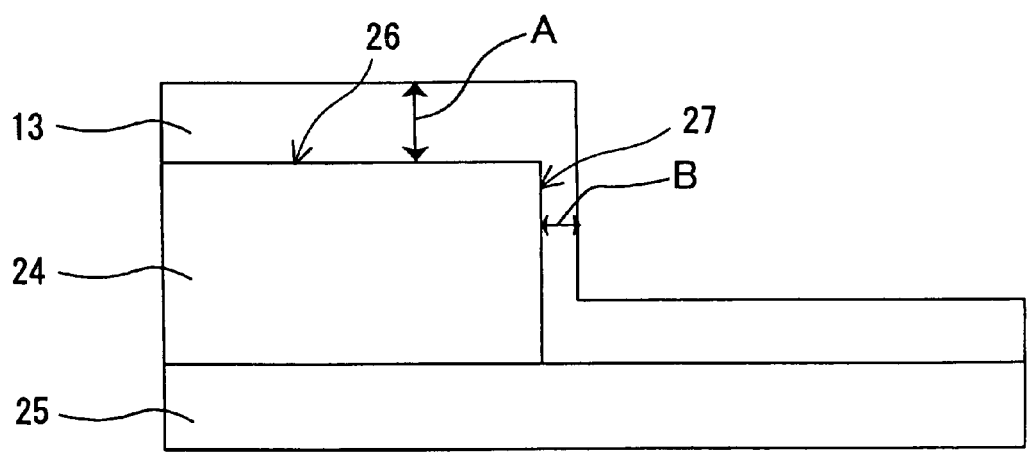
FIG. 4 is a cross-sectional view schematically showing the thickness A of the gate insulating film on the top surface of the semiconductor layer on the silicon wafer substrate and the thickness B of the gate insulating film on the side surface of the semiconductor layer on the silicon wafer substrate.
Figure 5:
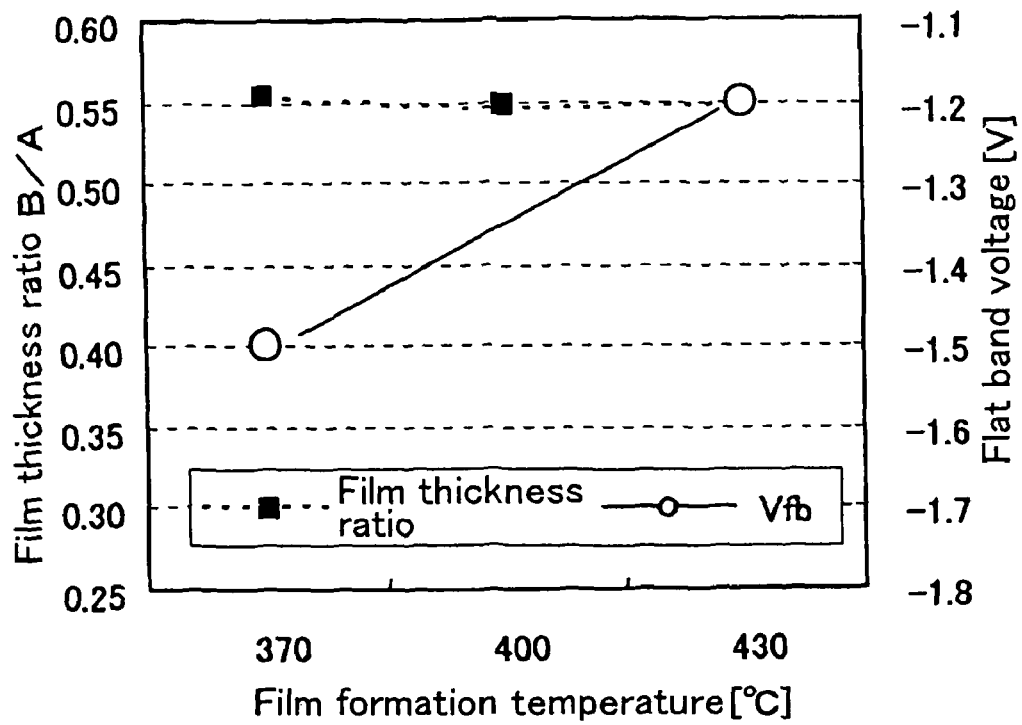
FIG. 5 is a graph showing relationships between the film formation temperature, and the flat band voltage and the film thickness ratio B/A where the thickness of the gate insulating film on the side surface of the semiconductor layer is defined as B and the thickness of the gate insulating film on the top surface of the semiconductor layer is defined as A, in Embodiments 1 to 3.
Figure 6:
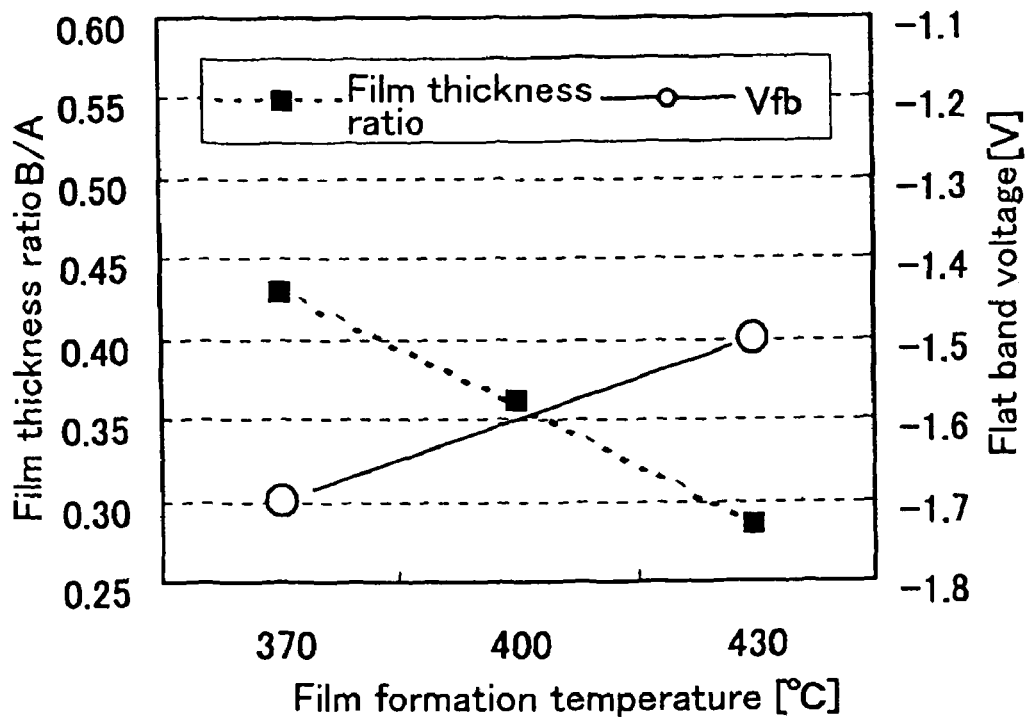
FIG. 6 is a graph showing relationships between the film formation temperature, and the flat band voltage and the film thickness ratio B/A where the thickness of the gate insulating film on the side surface of the semiconductor layer is defined as B and the thickness of the gate insulating film on the top surface of the semiconductor layer is defined as A, in Comparative Embodiments 2 to 4.
Figure 7:
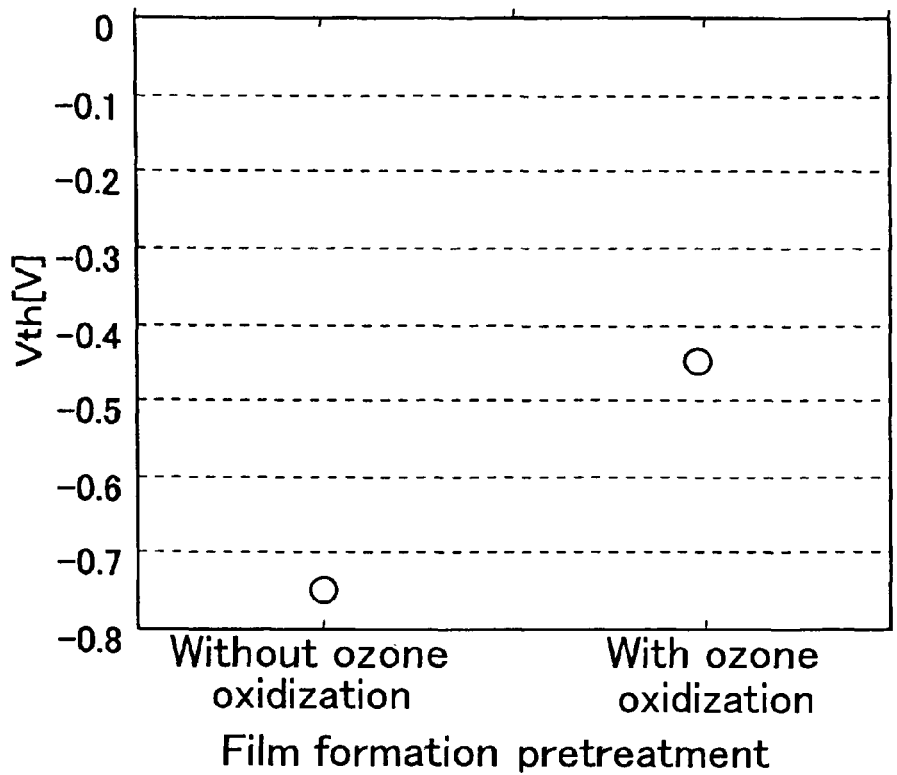
FIG. 7 is a graph showing a relationship between the ozone oxidization and the threshold voltage (Vth), in Embodiments 2 and 4.
Figure 8:
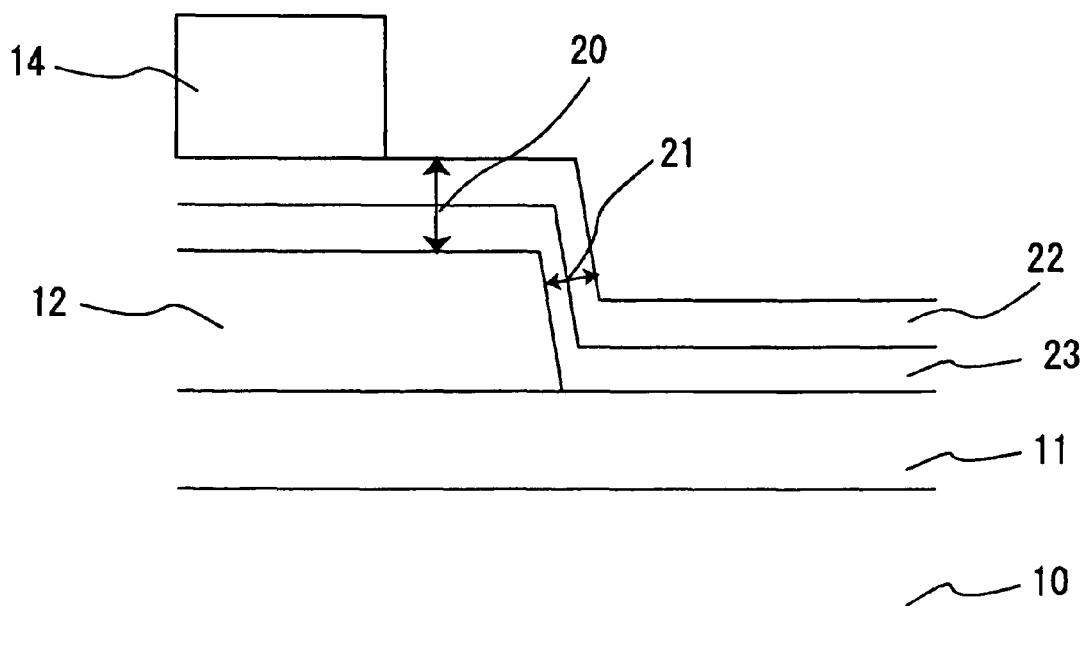
FIG. 8 is a cross-sectional view schematically showing the thickness A of the gate insulating film on the top surface of the semiconductor layer and the thickness B of the gate insulating film on the side surface of the semiconductor layer of the present invention.

2: Amorphous silicon (a-Si) film
10: Glass substrate (insulating substrate)
11: Base coat insulating film
12: Semiconductor layer
13: Gate insulating film
13*a*: Silicon oxide ($SiO_2$) film
13*b*: Silicon nitride (SiNx) film
14: Gate electrode
15: Phosphorus ion (impurity ion)
16*a*: Source region
16*b*: Drain region
17: Channel region
18: Inter layer insulating film
19*a*, 19*b*: Contact hole
20*a*: Source electrode
20*b*: Drain electrode
20: Average thickness of the gate insulating film on the top surface of the semiconductor layer
21: Minimum thickness of the gate insulating film on the side surface of the semiconductor layer
22: Upper gate insulating film
23: Lower gate insulating film
24: Silicon oxide layer
25: Silicon wafer substrate
26: Horizontal part of the silicon oxide layer
27: Vertical part of the silicon oxide layer

The invention claimed is:

1. A thin film transistor, comprising:
   a semiconductor layer, a gate insulating film, a gate electrode on a substrate in this order, wherein
   a cross section of the semiconductor layer has a forward tapered shape,
   the gate insulating film covers a top surface and a side surface of the semiconductor layer such that a vertical thickness of the gate insulating film above the top surface of the semiconductor layer is thicker than a lateral thickness of the gate insulating film on the side surface of the semiconductor layer,
   the gate insulating film has a multilayer structure including a silicon oxide film on a semiconductor layer side and a film made of a material with a dielectric constant higher than a dielectric constant of silicon oxide on a gate electrode side,
   the gate insulating film satisfies $0.5 \leq B/A$ where a thickness of the gate insulating film on the top surface of the semiconductor layer is defined as A and a thickness of the gate insulating film on the side surface of the semiconductor layer is defined as B, and
   the thickness of the gate insulating film is 70 nm or less on a silicon oxide capacitance equivalence basis.

2. The thin film transistor according to claim 1, wherein the film made of a material with a dielectric constant higher than a dielectric constant of silicon oxide is a silicon nitride film.

3. The thin film transistor according to claim 1, wherein the side surface of the semiconductor layer has a taper angle of 60° or more.

4. A method of forming a thin film transistor, the method comprising:
   forming a semiconductor layer, a gate insulating film, a gate electrode on a substrate in this order, wherein
   a cross section of the semiconductor layer has a forward tapered shape;
   the gate insulating film covers a top surface and a side surface of the semiconductor layer such that a vertical thickness of the gate insulating film above the top surface of the semiconductor layer is thicker than a lateral thickness of the gate insulating film on the side surface of the semiconductor layer,
   the gate insulating film has a multilayer structure including a silicon oxide film on a semiconductor layer side and a film made of a material with a dielectric constant higher than a dielectric constant of silicon oxide on a gate electrode side,
   the gate insulating film satisfies $0.5 \leq B/A$ where a thickness of the gate insulating film on the top surface of the semiconductor layer is defined as A and a thickness of the gate insulating film on the side surface of the semiconductor layer is defined as B, and
   the thickness of the gate insulating film is 70 nm or less on a silicon oxide capacitance equivalence basis.

5. The method for producing the thin film transistor of claim 4, wherein the semiconductor layer is oxidized using ozone before forming the gate insulating film.

6. A semiconductor device comprising the thin film transistor of claim 1.

7. An active matrix substrate comprising the thin film transistor of claim 1.

8. A display device comprising the active matrix substrate of claim 7.

9. The display device according to claim 8, wherein the display device is a liquid crystal display device.

10. The method for producing the thin film transistor of claim 4, wherein the gate insulating film having the multilayer structure is continuously formed in one vacuum chamber without breaking vacuum at 400° C. or more.

11. A thin film transistor, comprising:
    a semiconductor layer on a substrate;
    a gate insulating film on the semiconductor layer, the gate insulating film being a multilayer structure comprising a plurality of films including first and second films, the gate insulating being formed so as to cover top and side surfaces of the semiconductor layer; and
    a gate electrode on the gate insulating film above the top surface of the semiconductor layer,
    wherein a vertical thickness of the gate insulating film above the top surface of the semiconductor layer is thicker than a lateral thickness of the gate insulating film on the side surface of the semiconductor layer, and a ratio of the lateral to vertical thicknesses of the gate insulating film is substantially equal to 0.5 or greater, and
    wherein for each film of the plurality of films of the gate insulating film, a thickness of the film is set in consideration of a dielectric constant of the film such that a total thickness of the gate insulating film is substantially 70 nm or less on a silicon oxide capacitance equivalence basis.

12. The thin film transistor according to claim 11,
wherein the first film of a first dielectric constant is formed on the semiconductor layer and the second film of a second dielectric constant is formed on the first film, and
wherein the dielectric constant of the second film is greater than the dielectric constant of the first film.

13. The thin film transistor according to claim 12,
wherein the first film is a silicon oxide film, and
wherein the dielectric constant of the second film is substantially equal to 1.5 time the dielectric constant of the silicon oxide film or greater.

14. The thin film transistor according to claim 12,
wherein the first film is a silicon oxide film, and
wherein the second film is any one or more of SiNx, $TiO_2$, $Al_2O_3$, $Ta_2O_5$, $HfO_2$, and $ZrO_2$.

15. The thin film transistor according to claim 14, wherein an absolute value of a withstand voltage of the gate insulating film is greater than 50 V and an absolute value of a threshold voltage is less than 0.8 V.

16. The thin film transistor according to claim 15, wherein the absolute value of the threshold voltage of the gate insulating film is less than 0.5 V.

17. The thin film transistor according to claim 12, wherein a cross section of the semiconductor layer has a forward tapered shape with a taper angle of more than 80°.

* * * * *